(12) United States Patent
Mori et al.

(10) Patent No.: US 7,209,379 B2
(45) Date of Patent: Apr. 24, 2007

(54) STORAGE DEVICE AND SEMICONDUCTOR DEVICE

(75) Inventors: Hironobu Mori, Nagasaki (JP);
Hidenari Hachino, Nagasaki (JP);
Chieko Nakashima, Nagasaki (JP);
Tsutomu Sagara, Nagasaki (JP);
Nobumichi Okazaki, Kanagawa (JP);
Hajime Nagao, Nagasaki (JP)

(73) Assignee: Sony Corporation, Tokyo (JP)

( * ) Notice: Subject to any disclaimer, the term of this patent is extended or adjusted under 35 U.S.C. 154(b) by 57 days.

(21) Appl. No.: 11/224,856

(22) Filed: Sep. 13, 2005

(65) Prior Publication Data
US 2006/0067106 A1 Mar. 30, 2006

(30) Foreign Application Priority Data
Sep. 30, 2004 (JP) ............................ P2004-285714

(51) Int. Cl.
*G11C 11/00* (2006.01)
(52) U.S. Cl. ................... 365/148; 365/189.09
(58) Field of Classification Search ................. 365/148
See application file for complete search history.

(56) References Cited

U.S. PATENT DOCUMENTS

| 5,495,442 A | * | 2/1996 | Cernea et al. ......... 365/185.03 |
| 2003/0063494 A1 | * | 4/2003 | Kurosaki ............... 365/189.11 |
| 2003/0117834 A1 | * | 6/2003 | Iwata et al. ................. 365/158 |

* cited by examiner

*Primary Examiner*—Huan Hoang
*Assistant Examiner*—Kretelia Graham
(74) *Attorney, Agent, or Firm*—Sonnenschein Nath & Rosenthal LLP

(57) ABSTRACT

A storage device is proposed, which includes: a source line arranged along a row direction; a bit line arranged along a column direction; a storage element arranged at an intersection of the source line and the bit line; a writing circuit connected to one terminal of the bit line and applying a predetermined voltage to the bit line; and a voltage adjusting circuit connected to a storage element that is located closest to another terminal of the bit line; wherein the voltage adjusting circuit compares the voltage applied to the storage element located closest to the another terminal of the bit line with a setting voltage to thereby adjust the voltage that the writing circuit applies to the bit line.

12 Claims, 10 Drawing Sheets

STORAGE DEVICE AND SEMICONDUCTOR DEVICE

BACKGROUND OF THE INVENTION

1. Field of the Invention

The present invention relates to a storage device and a semiconductor device. More specifically, the present invention relates to a storage device composed of memory cells each using a storage element storing and holding information according to an electric resistance state and a semiconductor device having this storage device.

2. Description of Related Art

In information equipment such as a computer, high density DRAM (Dynamic Random Access Memory) with high operation speed is widely used as a random access memory.

However, since DRAM is volatile memory, which loses information upon turning off power, nonvolatile memory, which holds information after turning off power, has been desired.

As nonvolatile memory which is considered to be promising, there are proposed FeRAM (Ferroelectric Random Access Memory), MRAM (Magnetoresistive Random Access Memory), phase change memory, and resistance change type memory such as PMC (Programmable Metallization Cell) and RRAM.

The above-mentioned memories can hold written information for a long time without supplying power. Furthermore, it is considered that in the case of the above-mentioned memories, their non-volatility can make refreshing operation unnecessary and reduce power consumption.

Moreover, the resistance change type nonvolatile memory such as PMC and RRAM has a comparatively simple constitution in which a material having a property that a resistance value is changed by applying a voltage or a current is used for a storage layer storing and holding information, and two electrodes are provided so as to sandwich the storage layer therebetween and a voltage or a current are applied to these two electrodes. Therefore, the miniaturization of the storage element is easily achieved.

PMC has a structure in which an ionic conductor containing a predetermined metal is sandwiched between the two electrodes, and further, PMC utilizes a property that when causing the metal contained in the ionic conductor to be contained in either of the two electrodes and applying a voltage between the two electrodes, electric properties of the ionic conductor such as resistance or capacitance are changed.

More specifically, the ionic conductor is composed of a solid solution of chalcogenide and the metal (for example, amorphous GeS or amorphous GeSe), and either of the two electrodes contains Ag, Cu or Zn (for example, refer to Patent Document 1).

As a constitution of RRAM, there is introduced a constitution, for example, in which a polycrystalline $PrCaMnO_3$ thin film is sandwiched between two electrodes and by applying voltage pulses or current pulses, a resistance value of the $PrCaMnO_3$ which is a recording film is largely changed (for example, refer to Non-Patent Document 1). In addition, at information recording (writing) time and erasing time, voltage pulses different in polarity are applied.

Furthermore, as another constitution of RRAM, there is introduced a constitution, for example, in which $SrZrO_3$ (monocrystal or polycrystal) with a small quantity of Cr doped is sandwiched between two electrodes, and by causing current to flow from these electrodes, the resistance of a recording film is changed (for example, refer to Non-Patent Document 2).

In this Non-Patent Document 2, I-V characteristics of the storage layer are shown and threshold voltages in recording and erasing are ±5 V. In this constitution, the application of voltage pulses also enables recording and erasing. A necessary pulse voltage is ±1.1 V and a voltage pulse width is 2 ms. Furthermore, high speed recording and erasing is enabled and the operation at a voltage pulse width of 100 ns is reported. In this case, a necessary pulse voltage is ±5 V.

However, at present, it is difficult for FeRAM to perform nondestructive reading and since it performs destructive reading, the reading speed is slow. Furthermore, polarization reversal according to reading or recording is limited in number of times, thereby limiting writing in number of times.

Furthermore, since MRAM needs a magnetic field for recording, and a current flowing through wiring generates the magnetic field, a large amount of current is necessary in recording.

Furthermore, the phase change memory is memory in which voltage pulses with the same polarity and different magnitudes are applied to perform recording. Since this phase change memory performs switching by using temperature, there is an issue that it is sensitive to changes in environmental temperature.

Furthermore, PMC described in Patent Document 1, a crystallization temperature of amorphous GeS or amorphous GeSe is about 200° C., and crystallization of the ionic conductor deteriorates the properties. Accordingly, PMC disadvantageously cannot endure high temperatures in a step of manufacturing a storage element, for example, in a step of forming a CVD insulating film, a protecting film or the like.

Moreover, since both of the materials of the storage layers proposed in the constitutions of RRAM's described in Non-Patent Document 1 and Non-Patent Document 2 are crystalline, RRAM has problems that thermal processing at about 600° C. is necessary, that it is extremely difficult to manufacture monocrystal of the proposed materials, that miniaturization is difficult because the use of polycrystal brings about the influence of grain boundary, etc.

Furthermore, in the above-described RRAM's, it is proposed that a pulse voltage is applied for recording and erasing of information. However, in the proposed constitutions, the resistance value of the storage layer is changed after recording, depending on the pulse width of the applied pulse voltage. Such dependency of the resistance value after recording on the pulse width of the recording indirectly means that the resistance value is changed even if the same pulse is repeatedly applied.

For example, in the above-described Non-Patent Document 1, it is reported that in the case where the pulses with the same polarity are applied, the resistance value after recording is largely changed, depending on the pulse width. The resistance value has a characteristic that in the case of a short pulse width of not more than 50 ns, a resistance change rate by recording is smaller, and that in the case of a long pulse width of not less than 50 ns, as the pulse width becomes longer, the resistance value conversely approximates a resistance value before recording instead of being saturated at a certain value. Furthermore, Non-Patent Document 1 introduces features of a memory structure in which a storage layer and a MOS transistor for access control are connected in series, and arranged in an array. Here, it is reported that when the pulse width is changed within a range of 10 ns to 100 ns, the resistance value of the storage layer after recording is changed according to the pulse width. In the case of a still longer pulse width, the resistance is predicted to decrease again due to the property of the storage layer.

Namely, in RRAM, since the resistance value after recording depends on the magnitude of the pulse voltage and the pulse width, fluctuations in the magnitude of the pulse voltage and the pulse width cause fluctuations in the resistance value after recording.

Accordingly, a pulse voltage with a pulse width shorter than about 100 ns has a small resistance change rate by recording and easily comes under the influence of the fluctuations in the resistance value after recording. Therefore, it is difficult to perform stable recording.

Consequently, when recording at such a short-pulse voltage, a process (verification) of checking contents of information after recording needs to be performed in order to ensure recording.

For example, before recording, a process of reading and checking contents of information recorded on a storage element (resistance values of the storage layer), and recording is performed corresponding to a relationship between the checked contents (resistance values) and contents to be recorded (resistance values). Alternatively, for example, after recording, a process of reading and checking contents of information recorded on the storage element, and when the checked resistance is different from a desired resistance value, re-recording is performed to correct the resistance value to the desired one.

The above-described processes makes the time required for recording longer, and thus makes it difficult to overwrite data or the like at high speed.

In order to solve the above-described problems, there is proposed a storage device including a memory cell having a storage element having a characteristic that the application of a voltage not lower than a threshold voltage between both terminals changes a resistance value, and a circuit element connected to the storage element in series, which is a load, and the storage device has a characteristic that when the voltage applied between respective terminals of the storage element and the circuit element is not lower than a certain voltage which is higher than the threshold voltage, a combined resistance value of the storage element and the circuit element of the memory cell after the resistance value of the storage element has been changed from a high resistance value state to a low resistance value state becomes an almost steady value regardless of the magnitude of the voltage (refer to Patent Document 2). This storage device realizes stable recording and shortens the time required for recording of information.

[Patent Document 1] National Publication of Japanese Patent Application Translation No. 2002-536840

[Non-Patent Document 1] "Novel Colossal Magnetoresistive Thin Film Nonvolatile Resistance Random Access Memory (RRAM)" by W. W. Zhuang et al., Technical Digest "International Electron Devices Meeting", 2002, pp. 193

[Non-Patent Document 2] "Reproducible switching effect in thin oxide films for memory applications", by A. Beck et al., Applied Physics Letters, 2000, Vol. 77, pp. 139–141,

[Patent Document 2] Specification of Japanese Patent Application No. 2004-22121

SUMMARY OF THE INVENTION

However, in the resistance change type storage device performing data identification by identifying a high resistance value state and a low resistance value state of the storage element, when a current flows to the storage element in changing the resistance value of the storage element, a decrease in voltage is caused due to a long wiring resistance between a circuit for applying the voltage to the storage element (hereinafter, referred to as a voltage applying circuit) and the storage element. In particular, since in the case where the storage element is in a low resistance state, the flowing current is larger than that in the case where it is in a high resistance state, a large decrease in voltage is caused, resulting in applying a considerably low voltage to the storage element located far from the voltage applying circuit. On the other hand, if an excess voltage is applied by the voltage applying circuit in view of margin of the decrease in voltage, a high voltage is applied to the storage element located close to the voltage applying circuit.

Thus, a higher voltage is applied to the storage element located close to the voltage applying circuit, and a lower voltage is applied to the storage element located far from the voltage applying circuit, so that evenness of the applied voltage among the storage elements cannot be achieved. Furthermore, setting so as to apply a voltage higher than needed also results in an increase in power consumption.

The present invention is to be achieved in light of the above-described issues, and there is a need for providing a storage device which can evenly apply a voltage to storage elements and a semiconductor device having the storage device.

In order to fulfill the above-mentioned need, a storage device according to one embodiment of the present invention includes a source line arranged along a row direction, a bit line arranged along a column direction, a storage element arranged at an intersection of the source line and the bit line, a writing circuit connected to one terminal of the bit line and applying a predetermined voltage to the bit line, and a voltage adjusting circuit connected to the storage element that is located closest to another terminal of the bit line, wherein the voltage adjusting circuit compares the voltage applied to the storage element located closest to the above-mentioned another terminal of the bit line with a setting voltage to thereby adjust the voltage that the writing circuit applies to the bit line.

Furthermore, in order to fulfill the above-described need, a storage device according to another embodiment of the present invention includes a source line arranged along a row direction, a bit line arranged along a column direction, a storage element arranged at an intersection of the source line and the bit line, and having a characteristic that the application of an electric signal not lower than a first threshold signal allows the storage element to shift from a high resistance value state to a low resistance value state and that the application of an electric signal not lower than a second threshold signal, which has a polarity different from the first threshold signal, allows the storage element to shift from a low resistance value state to a high resistance value state, a writing circuit connected to one terminal of the bit line and applying a predetermined voltage to the bit line, and a voltage adjusting circuit connected to the storage element that is located closest to another terminal of the bit line, wherein the voltage adjusting circuit compares the voltage applied to the storage element located closest to the above-mentioned another terminal of the bit line with a setting voltage to thereby adjust the voltage that the writing circuit applies to the bit line.

Furthermore, in order to fulfill the above-described need, a semiconductor device according to one embodiment of the present invention has a storage device including a source line arranged along a row direction, a bit line arranged along a column direction, a storage element arranged at an intersection of the source line and the bit line, and having a characteristic that the application of an electric signal not lower than a first threshold signal allows the storage element to shift from a high resistance value state to a low resistance value state and that the application of an electric signal not lower than a second threshold signal, which has a polarity different from the first threshold signal, allows the storage element to shift from a low resistance value state to a high resistance value state, a writing circuit connected to one terminal of the bit line and applying a predetermined voltage to the bit line, and a voltage adjusting circuit connected to the storage element that is located closest to another terminal of the bit line, wherein the voltage adjusting circuit compares the voltage applied to the storage element located closest to the above-mentioned another terminal of the bit line with a setting voltage to thereby adjust the voltage that the writing circuit applies to the bit line.

Here, by the voltage adjusting circuit which compares the voltage applied to the storage element located closest to the above-mentioned another terminal of the bit line with the setting voltage to thereby adjust the voltage that the voltage applying circuit applies to the bit line, an even voltage can be applied to all the memory cells connected to the voltage applying circuit. Since in principle, a voltage decrease is not caused beyond the storage elements, the voltage applied to the storage element closest to the above-mentioned another terminal of the bit line is compared with the setting voltage.

Thus, in the above-described storage device and semiconductor device to which the present invention is applied, a voltage can be evenly applied to storage elements.

Further features of the invention, and the advantages offered thereby, are explained in detail hereinafter, in reference to specific embodiments of the invention illustrated in the accompanying drawings.

DESCRIPTION OF THE PREFFERED EMBODIMENTS

Hereinafter, the embodiment of the present invention is described with reference to the drawings to help understanding of the present invention. In the present embodiment, a resistance change type storage element (hereinafter, referred to as a memory element) is used in a memory cell to compose a storage device.

Figure 1:
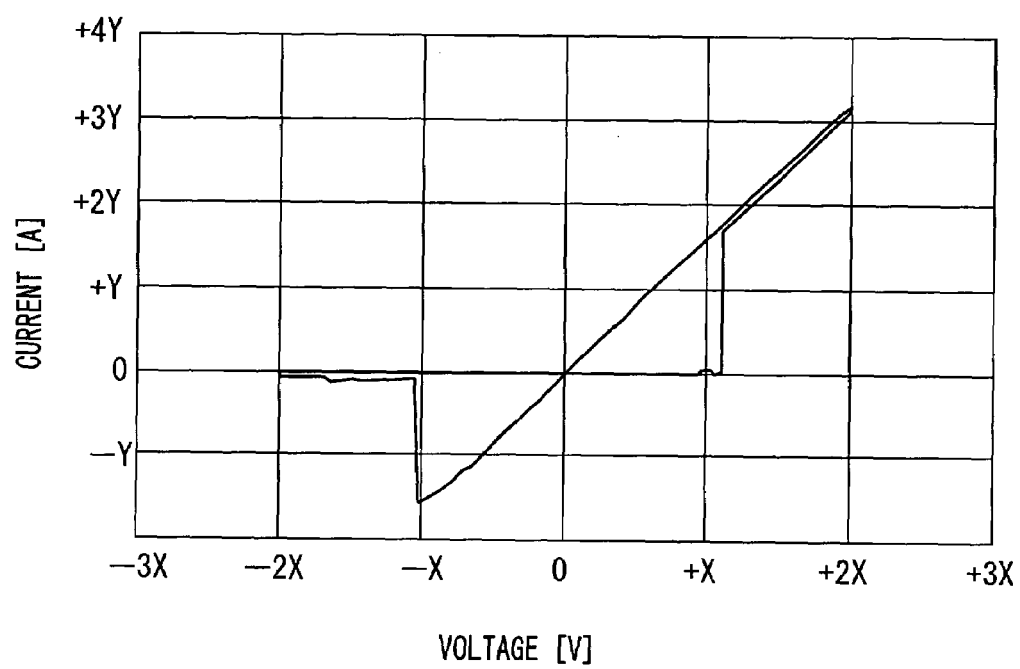
FIG. 1 is a graph showing changes in current-voltage used in one example of a storage device to which the present invention is applied.

FIG. 1 is a graph showing changes in current-voltage (I-V) used in one example of a storage device to which the present invention is applied.

As the memory element having I-V characteristics as shown in FIG. 1, there is exemplified a storage element which is structured such that a storage layer is sandwiched between a first electrode and a second electrode (for example, a lower electrode and an upper electrode) and such that the storage layer is composed of an amorphous thin film such as a rare earth oxide film, for example.

In this memory element, a resistance value in an initial condition is large (for example, 1 MΩ or more), which is a state in which it is difficult for a current to flow. However, when a voltage of +1.1 X [V] or higher (for example, ±0.5 V) as shown in FIG. 1 is applied, the current is rapidly increased and the resistance value is decreased (for example, several kΩ. The memory element transits to a state having an ohmic characteristic, in which the current flows in proportion to the voltage, namely, the resistance value shows a constant value, and then even if the voltage is returned to 0 V, the resistance value (low resistance value) is held.

Hereinafter, this operation is referred to as writing, and this state is referred to as continuity. An applied voltage at this time is referred to as a writing voltage threshold.

Next, a voltage having a reverse polarity to the writing is applied to the memory element, and the applied voltage is increased. Then, the current flowing through the memory element is rapidly decreased at −1.1 X [V](for example, −0.5 V) as shown in FIG. 1, namely, the resistance value is rapidly increased, and changed to a high resistance value as in the initial condition (for example, 1 MΩ or higher). Thereafter, even if the voltage is returned to 0 V, the resistance value (high resistance value) is held.

Hereinafter, this operation is referred to as erasing, and this state is referred to as insulation. Furthermore, the applied voltage is referred to as a erasing voltage threshold.

In this manner, the application of positive and negative voltages to the memory element allows the resistance value of the memory element to be reversibly changed from several kΩ to about 1 MΩ. Furthermore, when the voltage is not applied to the memory element, namely, when the voltage is 0 V, two states of continuity and insulation can be taken, and these states are made to correspond to data 1 and data 0, respectively, and are each stored as one bit of data.

In FIG. 1, the range of the applied voltage is from −2 X to +2 X. Even if the applied voltage is increased beyond this range, the resistance value is hardly changed in the memory element used for one example of the storage device to which the present invention is applied.

Figure 2A:
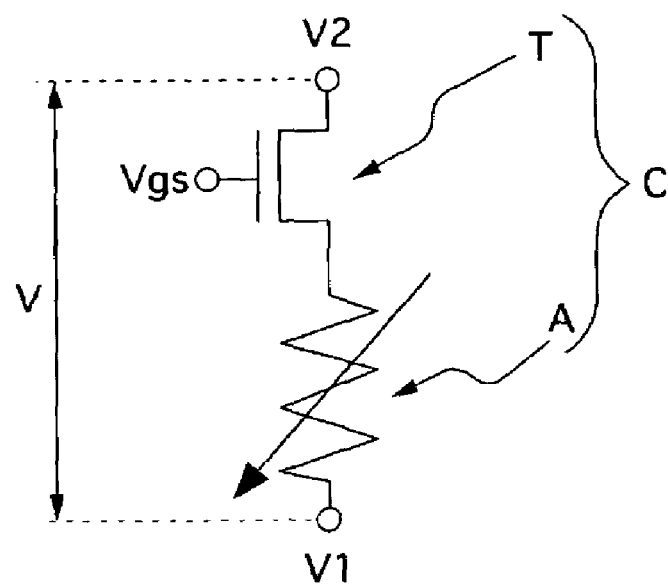
FIGS. 2A and 2B is circuit diagrams for explaining a memory cell used in one example of the storage device to which the present invention is applied.
Figure 2B:
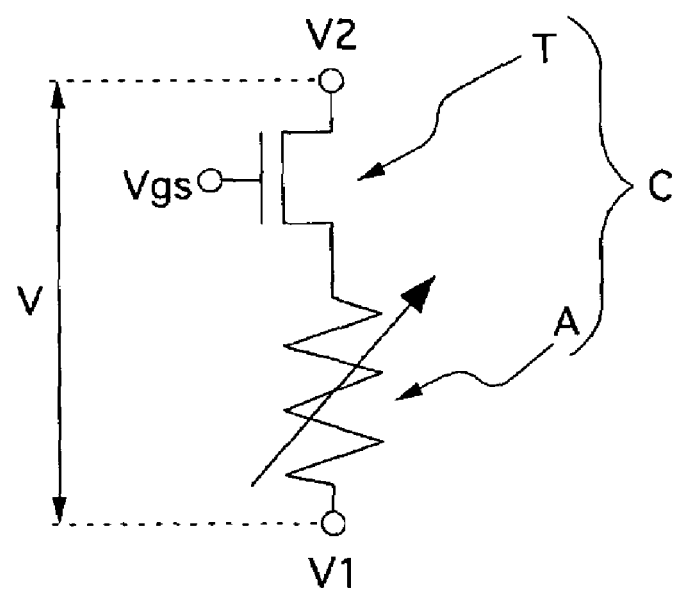

FIGS. 2A and 2B are circuit diagrams for explaining a memory cell used in one example of the storage device to which the present invention is applied. A memory cell C shown here is structured by connecting a MOS transistor T to a memory element A in series. Thereby, the MOS transistor acts as a load to the memory element.

Furthermore, the constitution is such that a terminal voltage V1 is applied to a terminal of the memory element on the opposite side of a terminal connected to the MOS transistor, and a terminal voltage V2 is applied to a terminal of the MOS transistor (for example, terminal on the source side) on the opposite side of a terminal connected to the memory element, and a gate voltage Vgs is applied to a gate of the MOS transistor.

By applying the terminal voltages V1 and V2 on the respective terminals of the memory element and the MOS transistor composing the memory cell, a potential difference V (=|V2−V1|) is generated between both of the terminals.

It is desirable that an on-resistance value of the MOS transistor be lower than a high resistance value of the memory element, and more desirable that it is sufficiently low, for example, one severalth of the high resistance value of the memory element or less.

This is because if the on-resistance value of the MOS transistor is high, most of the potential difference applied between the terminals is applied to the MOS transistor, so that power is lost and the applied voltages cannot be efficiently used for changes of the resistance of the memory element.

Here, two types of structures of memory cells based on the polarity of the memory element and the MOS transistor are considered as shown in FIGS. 2A and FIG. 2B.

Each of arrows of the memory cells in FIGS. 2A and 2B indicates its polarity, and shows that when a voltage is applied in the arrow direction, the memory element transits from an insulation state to a continuity state, that is, performs writing operation.

FIGS. 3 to 6 are circuit diagrams for explaining one example of the storage device to which the present invention is applied. Memory arrays shown here are each formed by arranging the memory cells shown in FIGS. 2A and 2B in a matrix. Based on the relationships of the polarity of the memory element and MOS transistor and the arrangement of the memory element and the MOS transistor, four types of memory array structures as shown in FIGS. 3, 4, 5 and 6 can be considered.

Figure 3:
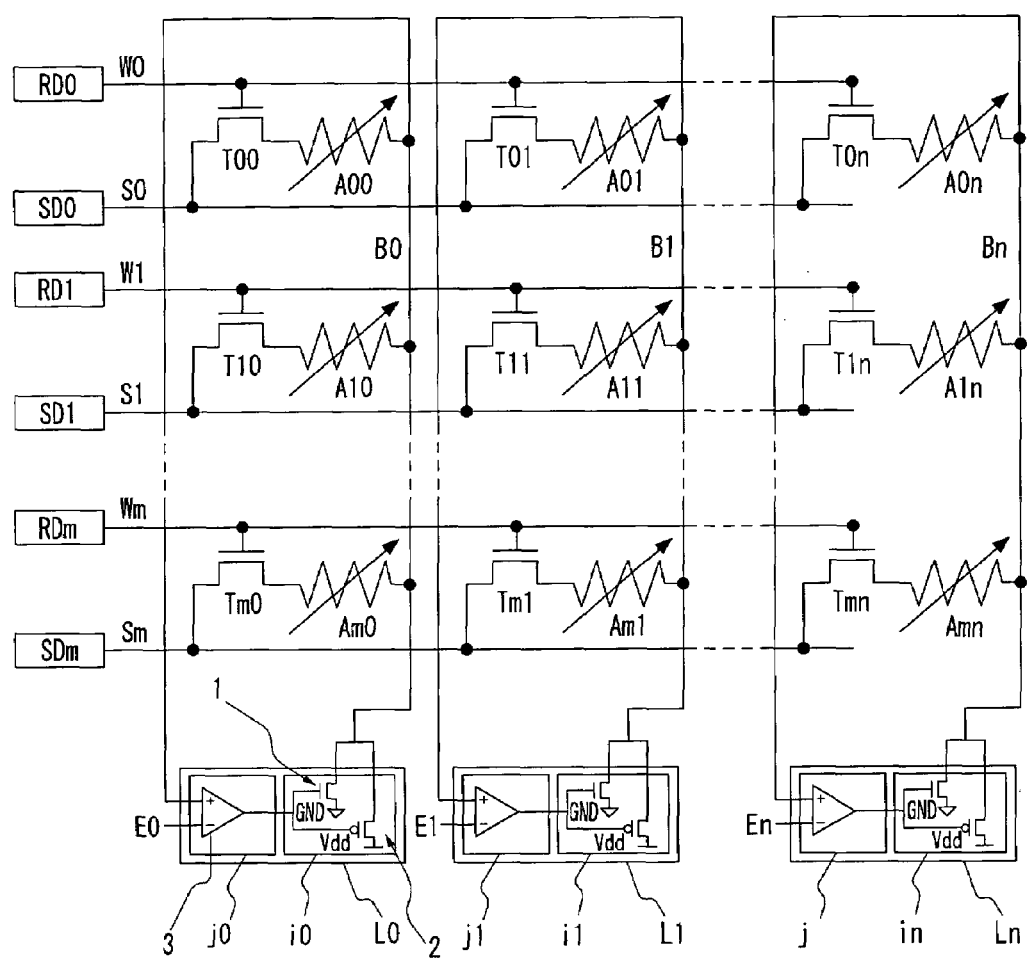
FIG. 3 is a circuit diagram (1) for explaining one example of the storage device to which the present invention is applied.
Figure 4:
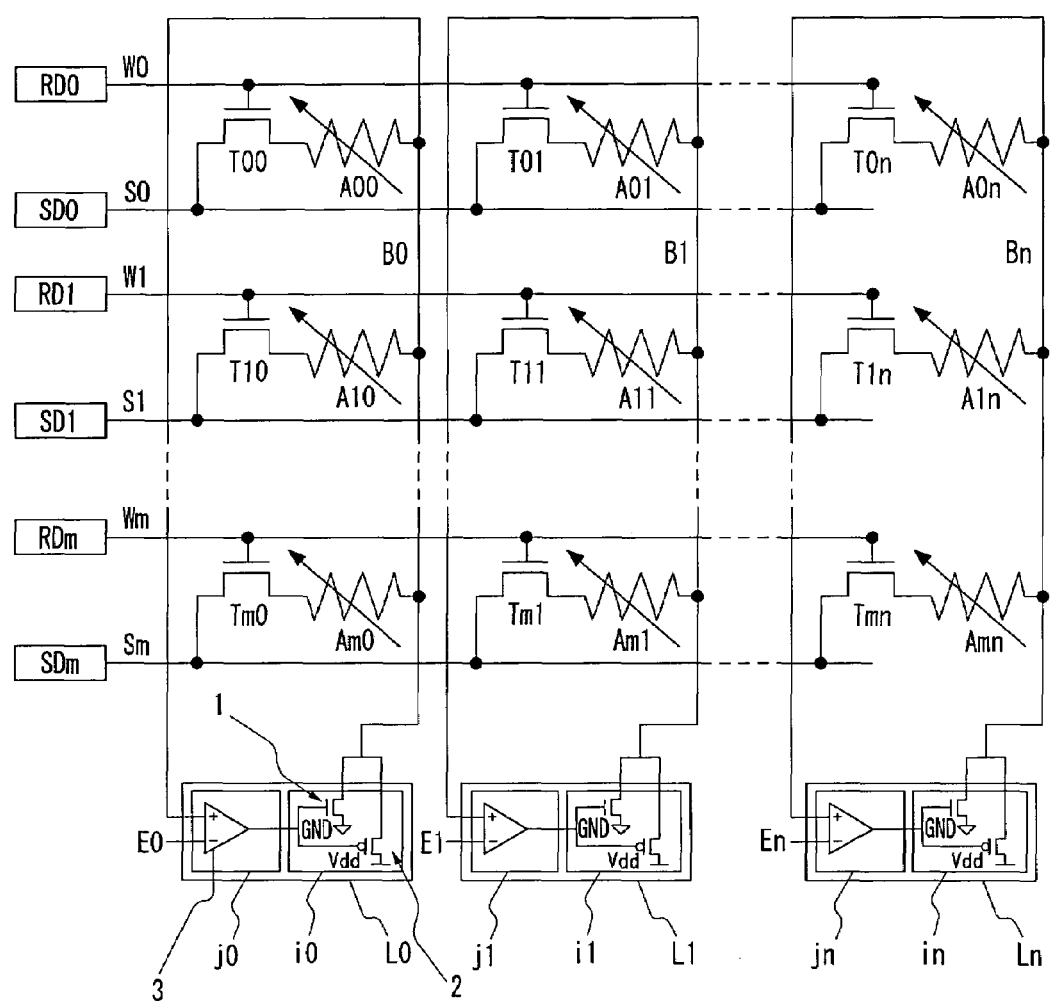
FIG. 4 is a circuit diagram (2) for explaining one example of the storage device to which the present invention is applied.
Figure 5:
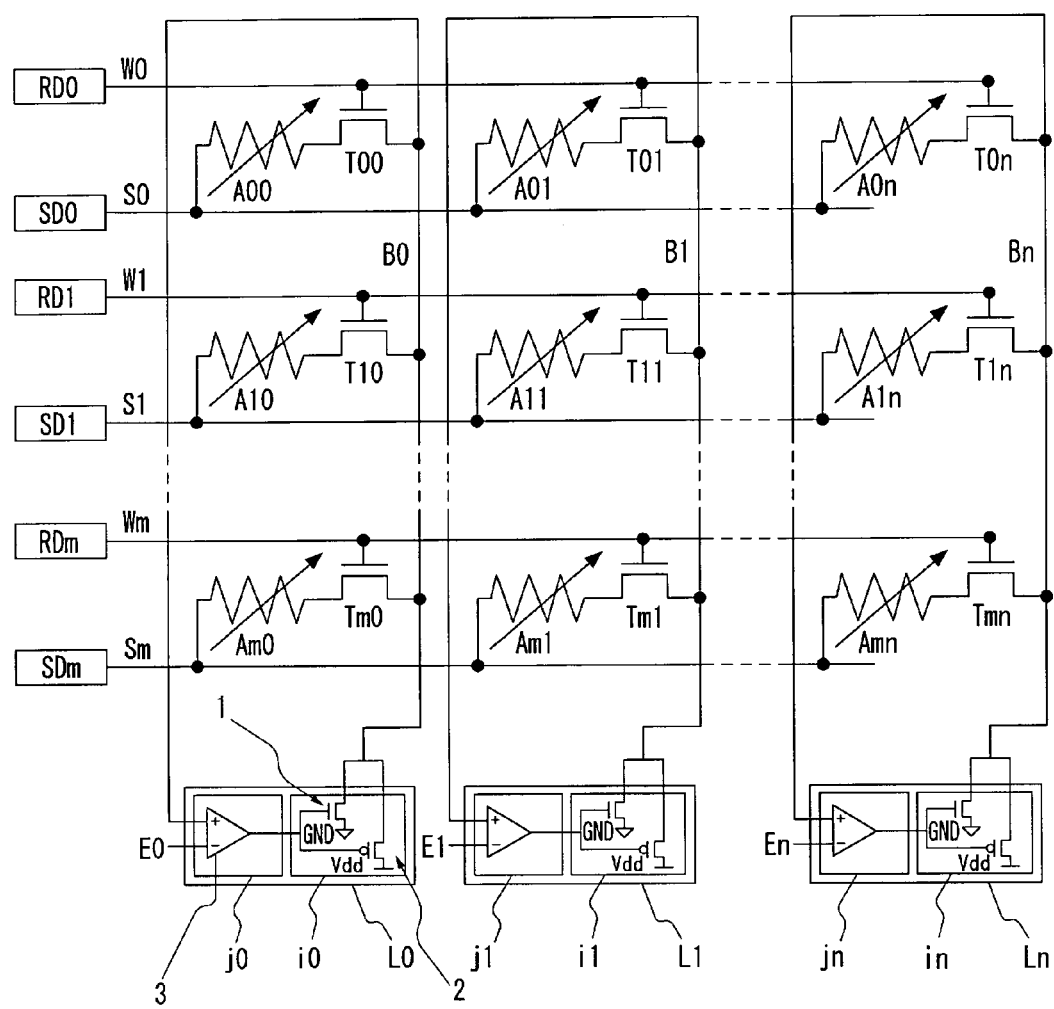
FIG. 5 is a circuit diagram (3) for explaining one example of the storage device to which the present invention is applied.
Figure 6:
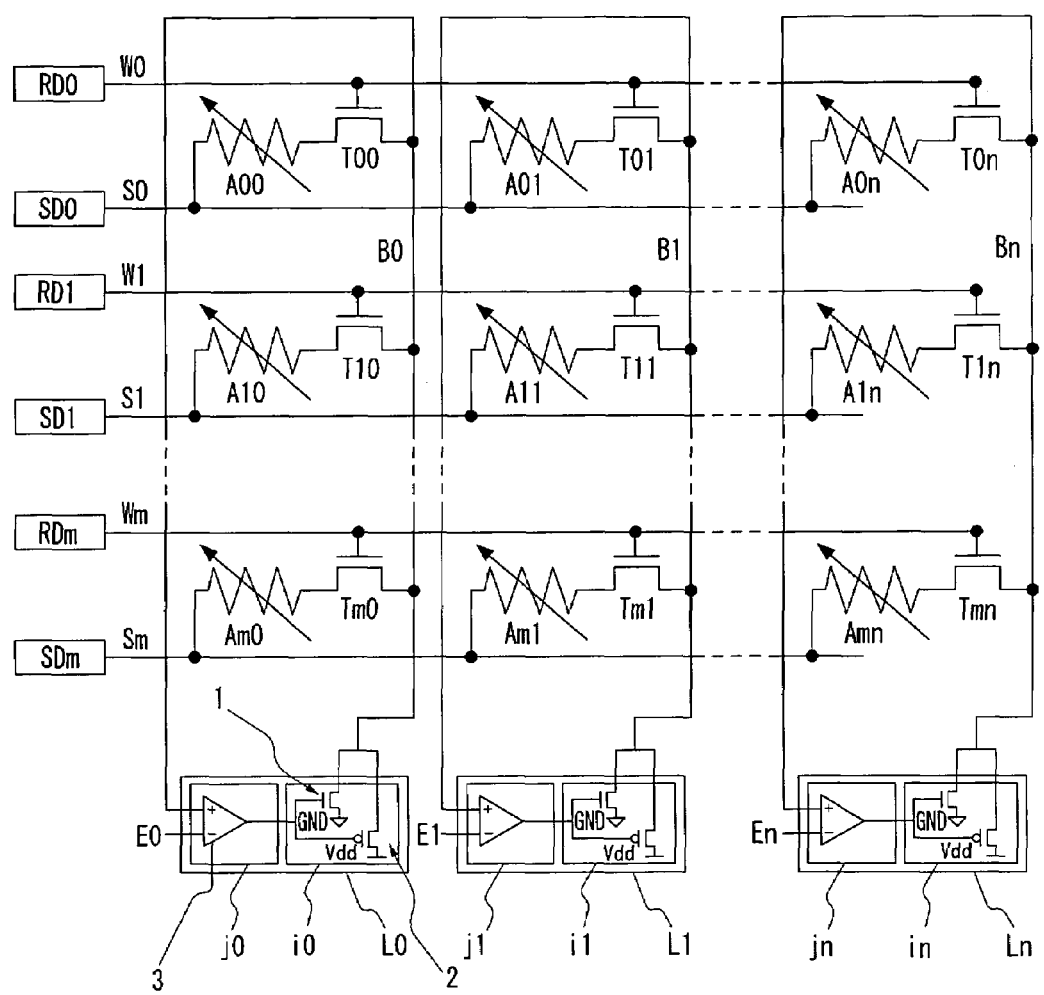
FIG. 6 is a circuit diagram (4) for explaining one example of the storage device to which the present invention is applied.

Here, since methods for operating the memory arrays are the same in FIGS. 3 to 6, a description of the method is given, taking the circuit of FIG. 3 as one example.

The storage device as shown in FIG. 3 is structured such that (m+1) rows and (n+1) columns of memory cells are arranged in a matrix, and each of the memory cells is structured by connecting one terminal of the memory element to one terminal of the MOS transistor (a drain, here).

Furthermore, a gate of the MOS transistors T (T00 to Tmn) is connected to a word line W (W0 to Wm), the other terminal of the MOS transistor (source) is connected to a source line S (S0 to Sm), and the other terminal of the memory element is connected to a bit line B (B0 to Bn). Furthermore, the bit line B is connected to a constant-voltage writing circuit L (L0 to Ln), the word line W is connected to a row decoder RD (RD0 to RDm) which is a voltage control circuit thereof, and the source line S is connected to a source decoder SD (SD0 to SDm) which is a voltage control circuit thereof.

The above-mentioned constant writing circuit has a writing circuit i (i0 to in) and a voltage adjusting circuit j (j0 to jn), and the writing circuit is composed of a writing driver 1 and an erasing driver 2. The voltage adjusting circuit is composed of an operation amplifier 3, and a setting voltage E to be applied to the memory cell is inputted into the negative-phase input side of the operation amplifier, and the positive-phase input side is connected to the bit line, and thus, the wiring is connected so that a potential of the memory cell in the first line, which is the farthest from the writing circuit, can be transmitted. A structure in which the connection relationship between the positive-phase input and the negative-phase input is reversed may be employed, as long as it exerts a function of keeping the writing voltage constant.

Here, in the present embodiment, a description is given, taking as an example a storage device in which one writing circuit and one voltage adjusting circuit are formed for one bit line. However, the writing circuit needs only to be capable of applying a voltage to the bit line, and the voltage adjusting circuit needs only to be capable of adjusting the voltage applied to the bit line by the writing circuit by comparing a reference voltage and a setting voltage, and thus, one writing circuit and one voltage adjusting circuit do not always need to be formed for one bit line, and the following three structures can also be employed.

Figure 7:
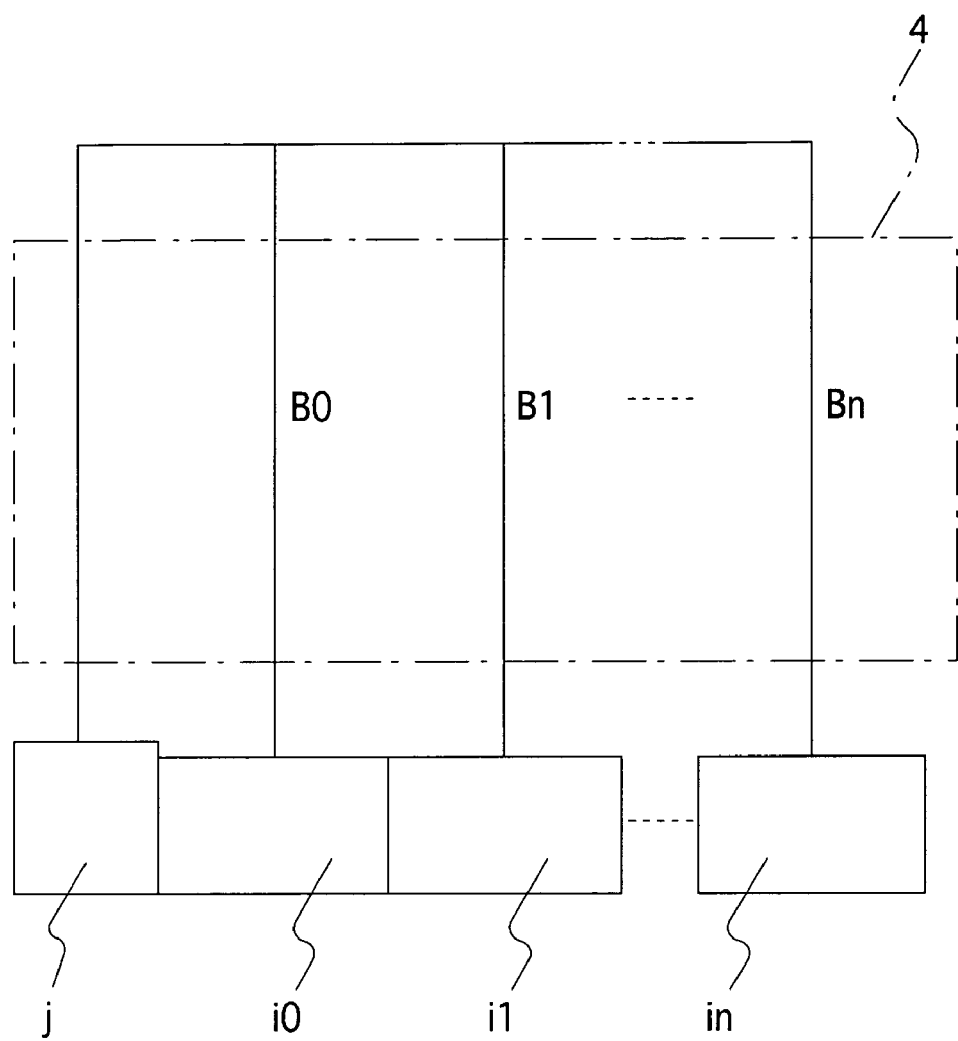
FIG. 7 is a schematic diagram (1) for explaining a modification of the present embodiment.

(1) One writing circuit may be formed for one bit line and one voltage adjusting circuit may be formed for the entire memory array 4 (refer to FIG. 7).

(2) A plurality of bit lines (e.g. six bit lines) may be connected to one writing circuit and one voltage adjusting circuit via column switches SW. Namely, one writing circuit may be formed for a plurality of bit lines (e.g. six bit lines) and one voltage adjusting circuit may be formed for the plurality of bit lines (e.g. six bit lines) (refer to FIG. 8).

Figure 8:
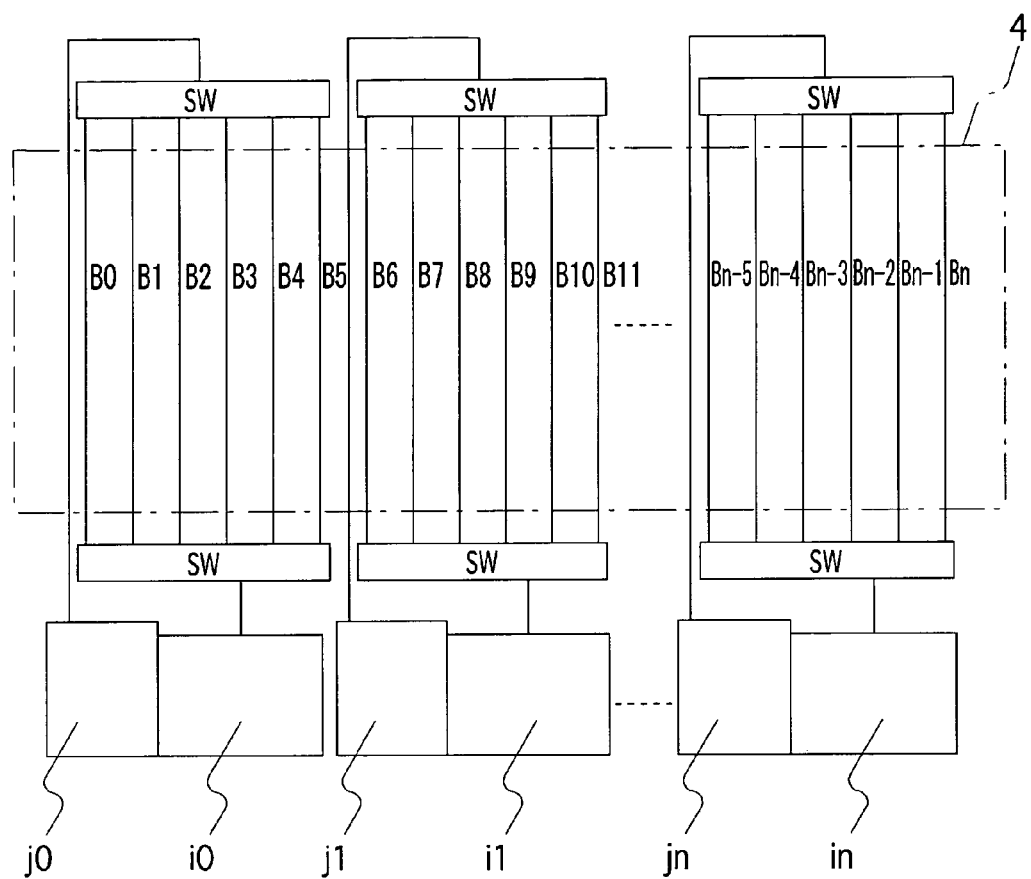
FIG. 8 is a schematic diagram (2) for explaining a modification of the present embodiment.
Figure 9:
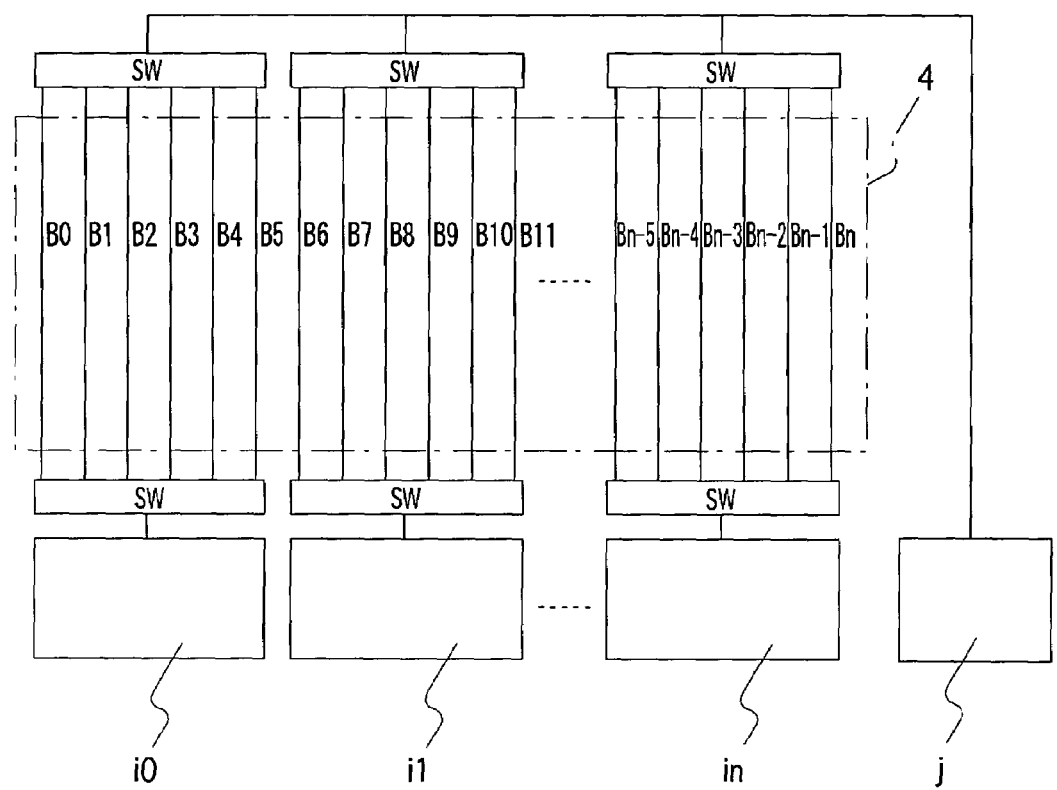
FIG. 9 is a schematic diagram (3) for explaining a modification of the present embodiment.

(3) A plurality of bit lines (e.g. six bit lines) may be connected to one voltage applying circuit via a column switch and all the bit lines may be connected to one voltage adjusting circuit via column switches. Namely, one writing circuit may be formed for a plurality of bit lines (e.g. six bit lines) and one voltage adjusting circuit may be formed for the whole memory array (refer to FIG. 9). In FIGS. 7, 8, and 9, writing drivers, erasing drivers, and operation amplifiers are omitted.

Furthermore, while in the present embodiment, the voltage adjusting circuit is arranged close to the writing circuit, the voltage adjusting circuit does not need to be arranged close to the writing circuit, and the following structures may be employed.

Figure 10:
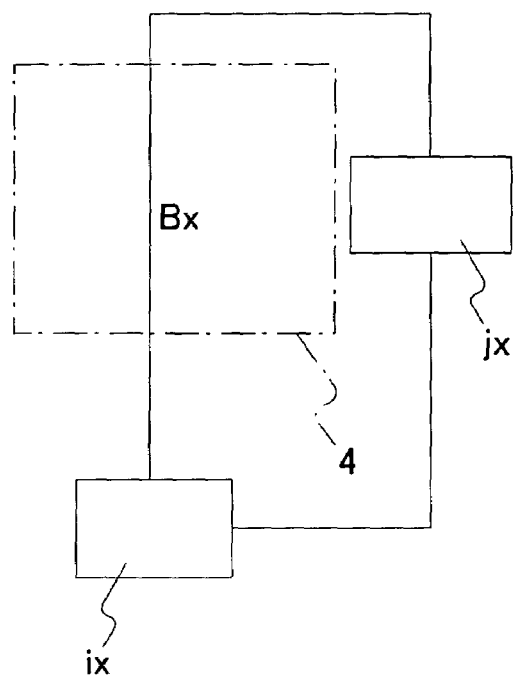
FIG. 10 is a schematic diagram (1) for explaining an arrangement of a voltage adjusting circuit.

(1) The voltage adjusting circuit may be arranged on the side of the memory array (refer to FIG. 10).

Figure 11:
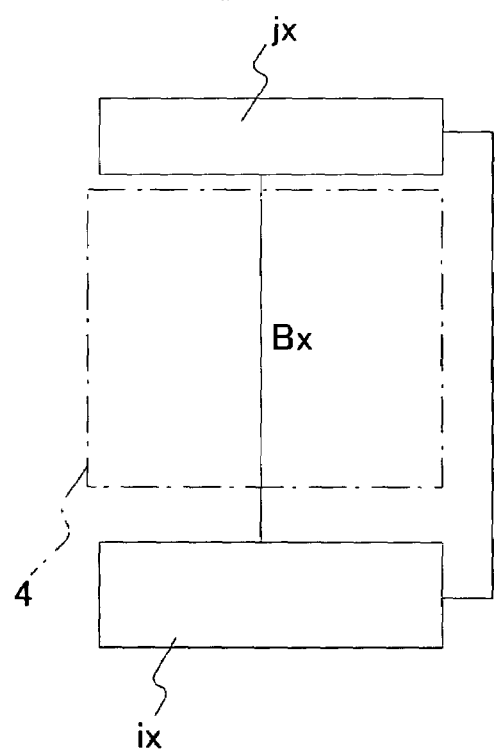
FIG. 11 is a schematic diagram (2) for explaining an arrangement of the voltage adjusting circuit.

(2) The voltage adjusting circuit may be arranged on the opposite side of the writing circuit via the memory array (refer to FIG. 11). In FIGS. 10 and 11, for convenience in description, only a writing circuit ix connected to an arbitrary bit line Bx and a voltage adjusting circuit jx for adjusting the applied voltage by the writing circuit are illustrated. Furthermore, in FIGS. 10 and 11, writing drivers, erasing drivers, and operation amplifiers are omitted.

As shown in the present embodiment, by arranging the voltage adjusting circuit close to the writing circuit, the delay of an output signal from the voltage adjusting circuit caused by a wiring capacity can be suppressed, and by arranging the voltage adjusting circuit on the side of the memory array as shown in FIG. 10, a length of output wiring of the voltage adjusting circuit and a length of wiring for feedback of the bit line potential can be the same, and by arranging the voltage adjusting circuit on the opposite side of the writing circuit via the memory array as shown in FIG. 11, the wiring for feedback of the bit line potential can be made shortest.

Now, (A) writing and (B) erasing of the storage element structured as described above are described. In states before starting the writing and the erasing, the bit line and the source line have the same potential, and the potential difference between the memory cells is 0 V.

(A) Writing

When writing is performed, the gate voltage Vgs is applied to the word line W corresponding to a memory cell on which information is recorded, by the row decoder RD to turn on the gate of the MOS transistor T, and the writing driver of the writing circuit is operated to apply a writing voltage to the bit line corresponding to the memory cell on which the information is recorded. This allows a voltage not lower than a writing voltage threshold to be applied to the memory element, and thereby the writing of the memory element is performed.

At this time, by using the voltage applied to the memory cell on the first line, which is located the farthest from the writing circuit, as a reference voltage, feedback is applied to the writing driver by the operation amplifier. This allows a correct setting voltage to be applied to all the memory cells connected to the writing circuit.

A writing time is controlled by pulse control, and after the writing time is finished, the writing circuit is stopped and the gate of the MOS transistor is turned off to finish the writing operation. Furthermore, for the writing voltage, an optimal voltage for each of the memory cells in view of yield and power consumption is set, and the writing voltage may be applied through an external terminal outside of the storage element, or the writing voltage may be set by using a trimming circuit provided inside of the storage device.

For example, if a resistance value of the memory element in a high resistance state is 1 kΩ, a size of the memory cell in a bit line direction is 1 μm, a bit line width is 0.26 μm, a sheet resistance is 0.1 Ω/square, a writing voltage threshold is −0.5 V, a current flowing at the writing voltage threshold is 5 μA, and the number of the memory cells in the bit line direction is 2048, then a voltage decrease by the wiring resistance during writing the memory cells from the first line to the 2048th line is 0.002V. However, in the storage device to which the present invention is applied, this difference can be neglected. Under a condition in which the memory element is in a high resistance state with a short bit line length and a small writing voltage threshold, the voltage decrease is small, so that the effect of the present invention is not so large.

(B) Deletion

When erasing is performed, the gate voltage Vgs is applied to the word line W corresponding to a memory cell from which information is erased, by the row decoder to turn on the gate of the MOS transistor T, and the erasing driver of the writing circuit is operated to apply a erasing voltage to the bit line corresponding to the memory cell from which the information is erased. This allows a voltage not lower than a erasing voltage threshold to be applied to the memory element and thereby, the erasing of the memory element is performed.

At this time, by using a voltage applied to the memory cell on the first line, which is located the farthest from the writing circuit, as a reference voltage, feedback is applied to the erasing driver by the operation amplifier. This allows a correct setting voltage to be applied to all the memory cells connected to the writing circuit.

A erasing time is controlled by pulse control similar to the writing time, and after the erasing time is finished, the writing circuit is stopped and the gate of the MOS transistor is turned off to finish the erasing operation. Furthermore, for the erasing voltage, an optimal voltage for each of the memory cells in view of yield and power consumption is set, and the erasing voltage may be applied through an external terminal outside of the storage element, or the erasing voltage may be set by using a trimming circuit provided inside of the storage device.

For example, if a resistance value of the memory element in a low resistance state is 100 kΩ, a size of the memory cell in the bit line direction is 1 μm, a bit line width is 0.26 μm, a sheet resistance is 0.1 Ω/square, an erasing voltage threshold is 0.5 V, a current flowing at the erasing voltage threshold is 500 μA, and the number of the memory cells in the bit line direction is 2048, then a voltage decrease by the wiring resistance during erasing the memory cells from the first line to the 2048th line is 0.2 V. However, in the storage device to which the present invention is applied, this difference can be neglected. Under a condition in which the memory element is in a low resistance state with a long bit line length and a large erasing voltage threshold, the voltage decrease is large, so that the effect of the present invention is large.

In the storage device to which the present invention is applied, by comparing the setting voltage to be applied to the respective memory cells by the writing circuit and the voltage applied to the memory cell on the first line, which is the farthest from the writing circuit, the voltage applied to the bit line by the writing circuit is adjusted. Namely, by using the voltage applied to the memory cell on the first line, as a reference voltage of the voltage adjusting circuit, feedback is applied to the writing circuit. Therefore, unevenness of the applied voltage caused by voltage decrease can be suppressed, and there are realized writing and erasing operations at a certain writing potential, and a certain erasing potential with respect to an arbitrary memory cell regardless of the size of the memory array.

It should be understood by those skilled in the art that various modifications, combinations, sub-combinations and alterations may occur depending on design requirements and other factors insofar as they are within the scope of the appended claims or the equivalents thereof.

The present invention contains subject mater related to Japanese Patent Application No. JP2004-285714 filed in the Japanese Patent Office on Sep. 30, 2004, the entire contents of which being incorporated herein by reference.

What is claimed is:

1. A storage device comprising:
   a source line arranged along a row direction;
   a bit line arranged along a column direction;
   a storage element arranged at an intersection of the source line and the bit line;
   a writing circuit connected to one terminal of the bit line and applying a predetermined voltage to the bit line; and
   a voltage adjusting circuit connected to a storage element that is located closest to another terminal of the bit line;
   wherein said voltage adjusting circuit compares the voltage applied to said storage element located closest to said another terminal of the bit line with a setting voltage to thereby adjust the voltage that said writing circuit applies to the bit line.

2. The storage device according to claim 1, wherein said voltage adjusting circuit is commonly connected to said another terminals of a plurality of the bit lines.

3. The storage device according to claim 1, wherein said voltage adjusting circuit is configured to connect to an arbitrary bit line through a first switching circuit connected to said another terminals of said a plurality of the bit lines.

4. The storage device according to claim 1, wherein said voltage adjusting circuit is configured to connect to an arbitrary bit line through a first switching circuit connected to said another terminals of said a plurality of the bit lines, and said writing circuit is provided with a second switching circuit which selects an arbitrary bit line from the plurality of the bit lines.

5. A storage device comprising:
   a source line arranged along a row direction;
   a bit line arranged along a column direction;
   a storage element arranged at an intersection of the source line and the bit line, and having a characteristic that the application of an electric signal not lower than a first threshold signal allows the storage element to shift from a high resistance value state to a low resistance value state and that the application of an electric signal not lower than a second threshold signal, which has a polarity different from the first threshold signal, allows the storage element to shift from a low resistance value state to a high resistance value state;
   a writing circuit connected to one terminal of the bit line and applying a predetermined voltage to the bit line; and
   a voltage adjusting circuit connected to a storage element that is located closest to another terminal of the bit line;
   wherein the voltage adjusting circuit compares the voltage applied to said storage element located closest to said another terminal of the bit line with a setting voltage to thereby adjust the voltage that said writing circuit applies to the bit line.

6. The storage device according to claim 5, wherein said voltage adjusting circuit is commonly connected to said another terminals of a plurality of the bit lines.

7. The storage device according to claim 5, wherein said voltage adjusting circuit is configured to connect to an arbitrary bit line through a first switching circuit connected to said another terminals of said a plurality of the bit lines.

8. The storage device according to claim 5, wherein said voltage adjusting circuit is configured to connect to an arbitrary bit line through a first switching circuit connected to said another terminals of said a plurality of the bit lines, and said writing circuit is provided with a second switching circuit which selects an arbitrary bit line from the plurality of the bit lines.

9. A semiconductor device having a storage device, said storage device comprising:
   a source line arranged along a row direction;
   a bit line arranged along a column direction;
   a storage element arranged at an intersection of the source line and the bit line, and having a characteristic that the application of an electric signal not lower than a first threshold signal allows the storage element to shift from a high resistance value state to a low resistance value state and that the application of an electric signal not lower than a second threshold signal, which has a polarity different from the first threshold signal, allows the storage element to shift from a low resistance value state to a high resistance value state;
   a writing circuit connected to one terminal of the bit line and applying a predetermined voltage to the bit line; and
   a voltage adjusting circuit connected to a storage element that is located closest to another terminal of the bit line;
   wherein the voltage adjusting circuit compares the voltage applied to said storage element located closest to said another terminal of the bit line with a setting voltage to thereby adjust the voltage that said writing circuit applies to the bit line.

10. The semiconductor device according to claim 9, wherein said voltage adjusting circuit is commonly connected to said another terminals of a plurality of the bit lines.

11. The semiconductor device according to claim 9, wherein said voltage adjusting circuit is configured to connect to an arbitrary bit line through a first switching circuit connected to said another terminals of said a plurality of the bit lines.

12. The semiconductor device according to claim 9, wherein said voltage adjusting circuit is configured to connect to an arbitrary bit line through a first switching circuit connected to said another terminals of said a plurality of the bit lines, and said writing circuit is provided with a second switching circuit which selects an arbitrary bit line from the plurality of the bit lines.

* * * * *